United States Patent [19]

Shimp

[11] 4,298,844
[45] Nov. 3, 1981

[54] SPLIT-BAND REDUNDANT AMPLIFIER SYSTEM
[75] Inventor: Richard L. Shimp, Waynesboro, Va.
[73] Assignee: ComSonics, Inc., Harrisonburg, Va.
[21] Appl. No.: 131,940
[22] Filed: Mar. 21, 1980
[51] Int. Cl.³ ............................ H03F 3/68; H03F 1/18
[52] U.S. Cl. .................................. 330/124 D; 330/51
[58] Field of Search ............................... 330/124 D, 51
[56] References Cited
U.S. PATENT DOCUMENTS
3,795,869  3/1974  Mionet et al. ........................... 330/51

Primary Examiner—James B. Mullins
Assistant Examiner—Gene Wan
Attorney, Agent, or Firm—Gerald J. Ferguson, Jr.; Joseph J. Baker; C. Lamont Whitham

[57] ABSTRACT

A split-band, redundant amplifier system is disclosed. The system has at least two identical amplifiers (1, 2) each capable of amplifying signals having frequencies within a predetermined pass band. A first filter (3) divides signals into at least two contiguous split-bands within the pass band. A second filter (5) combines the signals in the split-bands. In normal operation, the amplifiers are connected in parallel between the two filters, and each amplifier amplifies signals in only one of the split-bands. Switches (SW1, SW2, SW3, SW4, SW5, SW6, SW7, and SW8) are connected to the amplifiers and the filters and are operative to selectively connect an input signal to the first filter or to one of the amplifiers and to selectively connect the output of the second filter or the output of one of the amplifiers to the output of the system. A sensing circuit (7) is connected to the outputs of each of the amplifiers and detects when an amplifier becomes inoperative. When an amplifier becomes inoperative, the sensing circuit disconnects the inoperative amplifier from the first and second filters and connects an operative amplifier to the input and output of the amplifier system.

3 Claims, 1 Drawing Figure

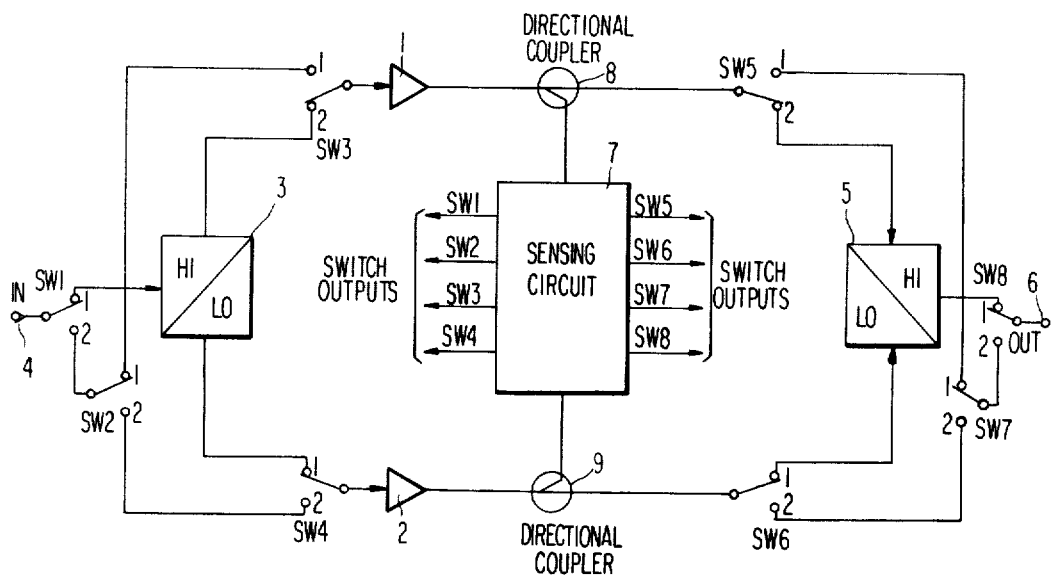

SPLIT-BAND REDUNDANT AMPLIFIER SYSTEM

BACKGROUND OF THE INVENTION

The present invention generally relates to amplifier systems, and more particularly to a split-band amplifier system which takes advantage of the inherent redundancy of such systems to provide an amplifier system having increased reliability without the need for additional amplifiers.

Split-band amplification is a technique wherein a plurality of amplifiers are connected in parallel with each amplifier being assigned a limited portion of a predetermined pass band for amplification. In other words the pass band of the amplifier system is divided into a plurality of contiguous split-bands by filters, and the outputs of the filters are connected to respective ones of the amplifiers for amplification of signals within the individual split-bands. The outputs of the amplifiers are then combined to provide a single, amplified output covering the entire pass band. There are many applications of split-band amplification ranging from audio to microwave frequency bands. In general, split-band amplification may be used whenever the frequency band of the signals to be amplified is relatively wide. Obviously, this technique would be used if the frequency band exceeds the bandwidth of the individual amplifiers that would be used in the system, but the technique is often used even if the frequency band is well within the bandwidth of the individual amplifiers in order to avoid intermodulation products. Such intermodulation products can occur when signals of substantially different frequencies are amplified in the same amplifier and represent a degradation of the original signal.

One application of split-band amplification is in the field of CATV systems. As the art is being advanced to include a greater number of channels, a very serious problem is encountered which causes a rather substantial cost increase in the implementation of such systems. Cable television is a system of signal distribution which to this point in time was capable of transporting a plurality of television signals for a reasonable distance while maintaining intermodulation distortion characteristics invisible to the most scrutinous viewer. Over the years, a larger number of channels was being demanded and amplifier linearity was sufficiently improved so that overall, these distortion products remained essentially below the visibility threshold with no significant change to the usable cascade length. The latest move to 52 channels makes linearity demands on the amplifying system which at this point are not available. As a result, the length of a single cascade is substantially reduced which forces the inclusion of more signal origination points than are economically viable. Through the utilization of split-band amplifiers the channel loading or discrete carriers, as the case may be, are shared thereby providing a means to again make cascades of such wideband circuits feasible while maintaining high quality signals. Split-band amplifiers will, of course, provide the desired high quality signal, but amplifiers in a CATV system are distributed along the cable and, therefore, not immediately accessible in the event of an amplifier failure. Typically, reliability is provided by building redundancy into the system. In other words, in the case of the failure of an amplifier, a redundant amplifier is available to be automatically switched into the circuit in place of the failed amplifier. The provision of redundant amplifiers greatly increases the reliability of the system; however, this reliability is at the expense of greatly increased cost and complexity, and in the case of split-band amplification systems, the expense is often prohibitive. As a result, there is often the necessity of making a choice between high quality amplification and reliability.

Another application of split-band amplification is in the field of satellite communication systems. Because of the very high costs of the satellite transponders, it is mandatory that both high quality amplification and good reliability be built into these devices. However, there are other factors which must also be considered, chief among which are space and weight.

It is therefore an object of this invention to provide a split-band amplifier system which takes advantage of the inherent redundancy of such systems to provide increased reliability without the need for additional amplifiers.

It is a more specific object of the invention to provide a highly reliable amplifier system for use in a CATV system, which amplifier system is capable of high quality, wideband amplification permitting cascading of such amplifier systems over considerable distances.

SUMMARY OF THE INVENTION

The split-band, redundant amplifier system according to the invention comprises at least two identical amplifiers each of which are capable of amplifying signals having frequencies within a predetermined pass band. A first filter means divides signals into at least two contiguous split-bands within the pass band. A second filter means combines the signals in the split-bands to provide a single, amplified output. In normal operation, the amplifiers are connected in parallel between the two filter means, and each amplifier amplifies signals in only one of the split-bands assigned to that amplifier. Switching means are connected to the amplifiers and the filter means and are operative to selectively feed an input signal to the first filter means or to one of the amplifiers and to selectively connect the output of the second filter means or the output of one of the amplifiers to the output of the amplifier system. Sensing means are connected to the outputs of each of the amplifiers to detect when an amplifier becomes inoperative. When the sensing means detects that one of the amplifiers has become inoperative, it disconnects the inoperative amplifier from the first and second filter means and connects the operative amplifier to the input and the output of the amplifier system.

BRIEF DESCRIPTION OF THE DRAWING

The specific nature of the invention, as well as other objects, aspects, uses and advantages thereof, will clearly appear from the following description and from the accompanying drawing, in which the sole FIGURE is a block diagram of a split-band, redundant amplifier system according to a preferred embodiment of the invention.

DESCRIPTION OF PREFERRED EMBODIMENT

As shown in the drawing, a pair of amplifiers 1 and 2 are connected in parallel to amplify contiguous split-bands of frequencies within the pass band of the amplifier system. The amplifiers 1 and 2 are identical and are each capable of amplifying signals within the entire pass band of the system. The split-bands are obtained by dividing the pass band of the system into two bands which may be, but are not necessarily, equal in bandwidth. In fact, it is often desirable that the lower frequency split-band have a narrower bandwidth than the higher frequency split-band. Division of the pass band of the system is accomplished with a filter network 3 of known design. The filter network 3 may be either passive or active and have either gradual or steep roll off frequency characteristics as may be dictated by the particular application or design criteria. The filter network 3 has an input which is normally connected to the system input terminal 4 by means of switch SW1. The outputs of filter network 3 are normally respectively connected to the inputs of amplifiers 1 and 2 by means of switches SW3 and SW4.

The amplified split-band signals are recombined in a second filter network 5 to provide a single, amplified output signal. Again, the filter network 5 is of known design and may be either passive or active and may, in addition, provide signal isolation by means of, for example, emitter or source follower circuits. The filter network 5 has two inputs, and these are normally respectively connected to the outputs of amplifiers 1 and 2 by means of switches SW5 and SW6. The output of the filter network 5 is normally connected to the system output terminal 6 by means of switch SW8.

It will be appreciated by those skilled in the art that the system thus far described is generally similar to conventional split-band amplifier systems known in the art. It will also be understood by those skilled in the art that while the system described and illustrated divides the pass band of the system into two split-bands, it is also possible to divide the pass band into more than two split-bands, each having any desired bandwidth within the pass band. The invention, however, requires that each of the amplifiers in the system be capable of amplifying signals within the entire pass band of the system.

What particularly distinguishes the invention from split-band amplifier systems known in the art is the provision of the several switches shown in the FIGURE. In addition to the switches already mentioned, there are also switches SW2 and SW7 which are not normally in the signal path. Each of switches SW1 to SW8 is illustrated as a STDP switch, but these switches may be electro-magnetic (for example, reed) or electronic (for example, FET) switches which are compatible with the frequencies and the switching speeds desired. The switches are individually controlled by a sensing circuit 7 connected to the outputs of amplifiers 1 and 2 by means of directional couplers 8 and 9, respectively. The sensing circuit 7 monitors the outputs of amplifiers 1 and 2 and detects a failure of either one. Such sensing circuits are known in the art and may comprise, for example, a rectifier, a charging circuit and a voltage level comparator for each amplifier. As long as there is an output from the amplifier, the rectified output will maintain a charge in the charging circuit which produces a voltage well above a preset threshold voltage supplied to the voltage level comparator. However, if the amplifier fails, the charge on the charging circuit will leak off after a predetermined period of time resulting in a voltage which falls below the threshold voltage. When that happens, the voltage level comparator produces an output indicating the failure of the amplifier.

The sensing circuit 7 controls the switches SW1 to SW8 according to Table I. In the table, the condition of each switch is indicated by its pole number, that is, a "1" for switch SW1 means that the input to that switch is connected to pole number 1 as indicated in the drawing. Where a dash appears instead of a pole number that means the switch can be in either condition. The letters "G" and "F" for the amplifiers mean "good" and "failed," respectively.

TABLE I

| AMP 1 | AMP 2 | SW1 | SW2 | SW3 | SW4 | SW5 | SW6 | SW7 | SW8 |
|-------|-------|-----|-----|-----|-----|-----|-----|-----|-----|
| G | G | 1 | 1 | 2 | 1 | 2 | 1 | 1 | 1 |
| F | G | 2 | 2 | — | 2 | — | 2 | 2 | 2 |
| G | F | 2 | 1 | 1 | — | 1 | — | 1 | 2 |

With reference to the drawing and Table I, it will be observed that in the event of the failure of amplifier 1, an input signal applied to input terminal 4 is connected via switches SW1, SW2 and SW4 directly to the input of the good amplifier 2. The filter circuit 3 and amplifier 1 are completely bypassed. In addition, the output of amplifier 2 is connected via switches SW6, SW7 and SW8 to output terminal 6, bypassing filter network 5. A similar analysis can be made in the event of the failure of amplifier 2. The important thing to appreciate is that because each of amplifiers 1 and 2 is capable of amplifying signals having frequencies within the entire pass band of the amplifier system, either one can assume the role of system amplifier in the event of failure of the other. There will, of course, be some degradation in performance due to the fact that the system is no longer providing split-band amplification, but this is a small price to pay for the superior reliability of the system. As will be apparent to those skilled in the art, the principles of the invention can also be applied to split-band amplification systems using more than two amplifiers.

I claim:

1. A split-band, redundant amplifier system having an input terminal and an output terminal comprising:
   at least two identical amplifiers each having an input and an output and capable of amplifying signals having frequencies within a predetermined pass band,
   first filter means having an input and at least two outputs for receiving signals at its input and dividing those signals into at least two contiguous split-bands within said predetermined pass band at its at least two outputs,
   second filter means having at least two inputs and an output for receiving signals in said at least two contiguous split-bands and combining those signals at its output,
   switching means connected to said at least two identical amplifiers and said first and second filter means for selectively connecting said input terminal to the input of said first filter means or one of said at least two identical amplifiers and for selectively connecting said output terminal to the output of said second filter means or one of said at least two identical amplifiers, said input terminal normally being connected to the input of said first filter means and said output terminal normally being connected to the output of said second filter means, and sensing means connected to the outputs of each of said at least two identical amplifiers for detecting when an amplifier becomes inoperative and for controlling said switching means to disconnect an inoperative amplifier from said first and second filter means and to connect an operative amplifier to said input and output terminals.

2. An amplifier system as recited in claim 1 wherein it has only two identical amplifiers, said first filter means has only two outputs and divides signals into a high frequency split-band at one of said two outputs and a low frequency split-band at the other of said two outputs, and said second filter means has only two inputs and combines signals in said high frequency split-band with signals in said low frequency split-band.

3. An amplifier system as recited in claim 2 wherein said switching means comprises:

a first switch having an input and two outputs, said input being connected to said input terminal and one of said outputs being connected to the input of said first filter means, a second switch having an input and two outputs, said input being connected to the other one of the outputs of said first switch, a third switch having two inputs and one output, one of said inputs being connected to one of the outputs of said second switch, the other one of said inputs being connected to one of the outputs of said first filter means, and said output being connected to the input of one of said two identical amplifiers, a fourth switch having two inputs and one output, one of said inputs being connected to the other one of the outputs of said second switch, the other one of said inputs being connected to the input of the other one of said two identical amplifiers, a fifth switch having an input and two outputs, said input being connected to the output of one of said two identical amplifiers and one of said outputs being connected to one of the inputs of said second filter means, a sixth switch having an input and two outputs, said input being connected to the output of the other one of said two identical amplifiers and one of said outputs being connected to the other one of the inputs of said second filter means, a seventh switch having two inputs and an output, one of said inputs being connected to the other one of said two outputs of said fifth switch and the other one of said inputs being connected to the other one of said two outputs of said sixth switch, and an eighth switch having two inputs and an output, one of said inputs being connected to the output of said second filter means, the other one of said inputs being connected to the output of said seventh switch, and said output being connected to said output terminal.

* * * * *